United States Patent [19]

Plainer

[11] Patent Number: 5,518,426
[45] Date of Patent: May 21, 1996

[54] ELECTRICAL CONNECTOR AND METHOD OF ASSEMBLING AN ELECTRICAL CONNECTOR WITH ROWS OF INTERSPACED CONTACTS

[75] Inventor: Paul E. Plainer, Stratford, Conn.

[73] Assignee: Burndy Corporation, Norwalk, Conn.

[21] Appl. No.: 511,452

[22] Filed: Aug. 4, 1995

Related U.S. Application Data

[63] Continuation of Ser. No. 207,398, Mar. 7, 1994, abandoned.

[51] Int. Cl.[6] .................................................. H01R 13/10
[52] U.S. Cl. ....................... 439/682; 439/856; 439/872; 439/70
[58] Field of Search ................................ 439/70, 82, 83, 439/682–685, 444, 856, 871–873, 857

[56] References Cited

U.S. PATENT DOCUMENTS

| | | | |
|---|---|---|---|
| 3,418,621 | 12/1968 | Campbell, Jr. . | |
| 3,823,392 | 7/1974 | Pfeifer . | |
| 4,288,141 | 9/1981 | Leather . | |
| 4,317,609 | 3/1982 | Lapraik . | |
| 4,359,258 | 11/1982 | Palecek et al. ................ | 439/682 X |
| 4,395,086 | 7/1983 | Marsh . | |
| 4,466,684 | 8/1984 | Grant et al. .................... | 439/682 |
| 4,536,055 | 8/1985 | Kandybowski et al. . | |
| 4,591,230 | 5/1986 | Roldan . | |
| 4,618,209 | 10/1986 | Sonobe . | |
| 4,795,379 | 1/1989 | Sasaki et al. ................... | 439/856 |
| 4,850,904 | 7/1989 | Shimizu .......................... | 439/856 |
| 4,859,806 | 8/1989 | Smith .............................. | 174/68.5 |
| 4,907,990 | 3/1990 | Bertho et al. .................. | 439/682 X |
| 4,932,906 | 6/1990 | Kaley et al. .................... | 439/857 |
| 4,939,624 | 7/1990 | August et al. .................. | 361/424 |
| 5,004,426 | 4/1991 | Barnett ............................ | 439/82 |
| 5,015,191 | 5/1991 | Grabbe et al. ................. | 439/71 |
| 5,199,880 | 4/1993 | Arai ................................. | 439/65 |
| 5,211,567 | 5/1993 | Neumann et al. ............. | 439/74 |
| 5,228,861 | 7/1993 | Grabbe ............................ | 439/66 |
| 5,230,632 | 7/1993 | Baumberger et al. ......... | 439/66 |

*Primary Examiner*—Khiem Nguyen
*Attorney, Agent, or Firm*—Perman & Green

[57] ABSTRACT

An electrical connector having a housing with rows of offset interspaced contact receiving holes. The holes are angled along each row to facilitate interspacing of the holes with holes of adjacent rows. The electrical contacts are fabricated on a carry strip at an offset angle from the carry strip for simultaneous insertion into the angled holes of one of the rows of holes. Once the contacts are inserted into a row of the holes, the carry strip is removed. Angling the holes and interspacing them with holes in adjacent rows allows the spacing between the center paths of adjacent rows to be reduced. The offset angling of the contacts on the carry strips allows for fabrication of the contacts on the carry strip at a conventional pitch, but with nonetheless can be assembled to the housing to form a final contact spacing in the housing that is smaller than the conventional final contact spacing of prior art connectors. This allows for more contacts to be provided in the housing than in a similar size housing in prior art connectors.

17 Claims, 5 Drawing Sheets

5,518,426

ELECTRICAL CONNECTOR AND METHOD OF ASSEMBLING AN ELECTRICAL CONNECTOR WITH ROWS OF INTERSPACED CONTACTS

This is a continuation of application Ser. No. 08/207,398, filed on Mar. 7, 1994, abandoned.

BACKGROUND OF THE INVENTION

1. Field of the Invention

The present invention relates to electrical connectors and, more particularly, to an electrical connector with rows of interspaced contacts and a method of manufacturing the same.

2. Prior Art

U.S. Pat. Nos. 5,230,632; 3,418,621; 5,211,567 and 4,859,806 all disclose housings with staggered hole patterns. U.S. Pat. Nos. 4,317,609; 4,591,230; 3,823,392; 4,850,904; 4,795,379; 5,004,426; 4,932,906; 4,395,086; 4,536,055; 4,618,209 and 4,288,141 all disclose different types of contacts made from flat stock material. U.S. Pat. Nos. 5,015,191; 5,228,861 and 5,199,880 disclose other types of electrical connectors.

SUMMARY OF THE INVENTION

In accordance with one embodiment of the present invention a method of assembling an electrical connector is provided comprising steps of providing a housing having contact receiving holes aligned in parallel rows; providing a row of electrical contacts connected to each other by a carry strip, each of the contacts being offset at an angle of between about 20° and 70° relative to the carry strip, but having a center axis parallel to a plane of the carry strip; inserting the contacts into one of the rows of the receiving holes; and removing the carry strip from the contacts after the contacts are inserted into the receiving holes.

In accordance with another embodiment of the present invention an electrical connector is provided comprising a housing and electrical contacts. The housing has rows of parallel contact receiving holes. Each hole has a generally cross sectionally square shaped female contact mounting area. The holes in each row are offset from the holes in adjacent rows and, each hole is located, at least partially, between adjacent holes in an adjacent row. The electrical contacts are mounted to the housing in the female contact mounting areas. The contacts each have a contact receiving section with a general cross sectional U-shape. The U-shape of the contact receiving sections are angled relative to the paths of the rows such that the U-shape of the contact receiving sections are matingly aligned in the angled contact receiving holes and, are interspaced with contacts in adjacent rows.

In accordance with another embodiment of the present invention a method of manufacturing a carry strip having electrical contacts is provided comprising the steps of cutting a flat sheet of metal to form electrical contact blanks connected to the carry strip by a connecting arm, the connecting arm extending from the carry strip to a solder tail section of the contact blank; stamping the contact blanks to form the electrical contacts; and bending the contact arms to offset the electrical contacts from the carry strip at a predetermined angle, the contacts having a center axis that is parallel to a plane of the carry strip.

BRIEF DESCRIPTION OF THE DRAWINGS

The foregoing aspects and other features of the invention are explained in the following description, taken in connection with the accompanying drawings, wherein:

FIG. 3a is a sectional view of the housing shown in FIG. 2 taken along line 3a–3a;

FIG. 4a is a cross sectional view of the contact shown in FIG. 4 taken along line 4a–4a;

DETAILED DESCRIPTION OF THE INVENTION

Figure 1:
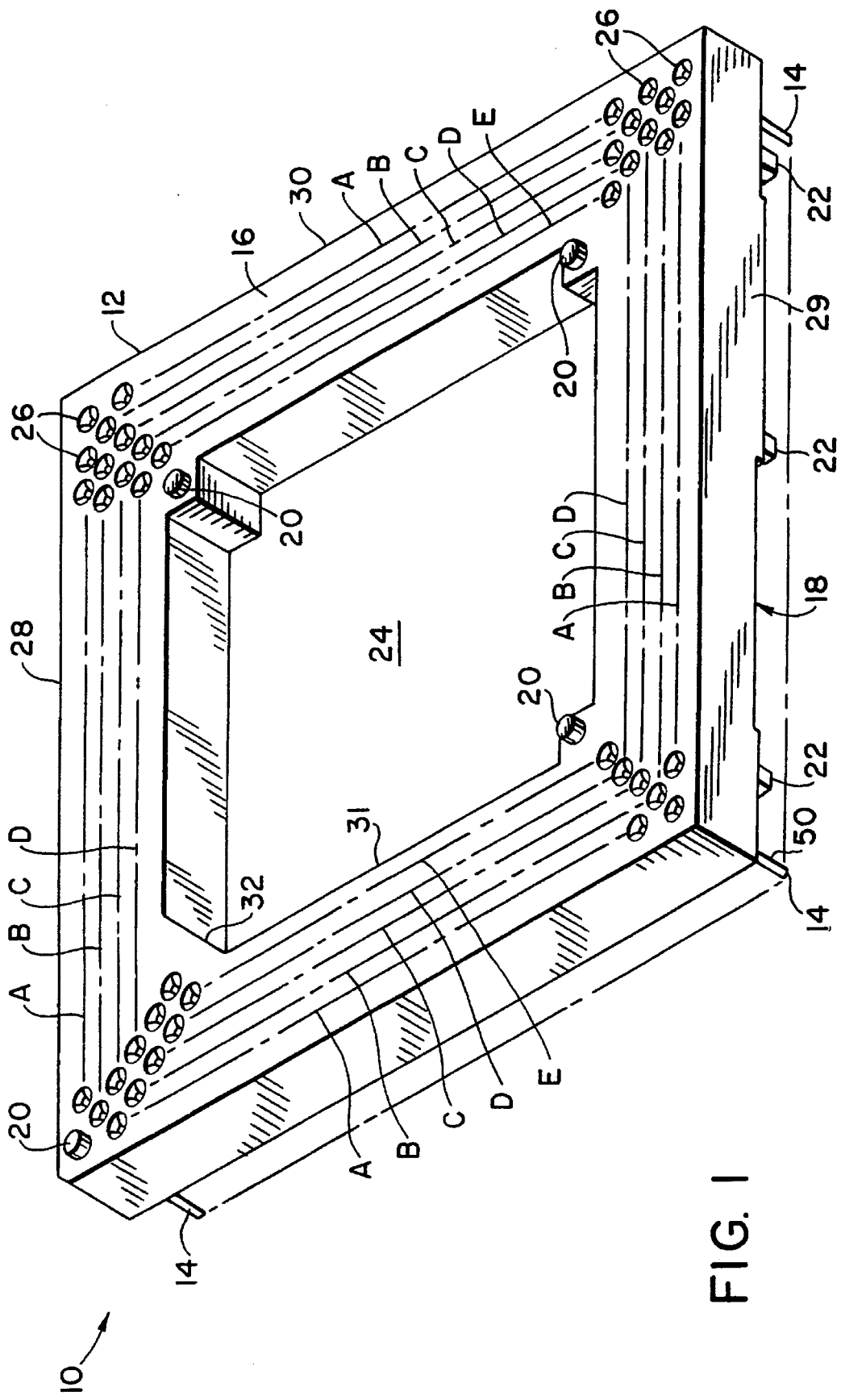
FIG. 1 is a perspective view of an electrical connector incorporating features of the present invention.

Referring to FIG. 1, there is shown a perspective view of an electrical connector 10 incorporating features of the present invention. Although the present invention will be described with reference to the single embodiment shown in the drawings, it should be understood that features of the present invention could be incorporated into various different forms and types of alternate embodiments. In addition, any suitable size, shape or type of elements or materials could be used.

The connector 10 generally comprises a housing 12 and electrical contacts 14. In the embodiment shown, the connector 10 is for removably connecting an integrated circuit chip module (not shown) to a printed circuit board (not shown). Integrated circuit chip modules are well known in the art, such as the PENTIUM chip sold by Intel Corp. PENTIUM is a trademark of Intel Corp. Integrated circuit chip modules, such as the PENTIUM chip, have male contact pins that extend from its bottom in a general square ring shape in parallel rows. The connector 10 is for connection of an integrated circuit chip module to a printed circuit board similar to the PENTIUM chip, but having a different pattern of contacts.

Figure 2:
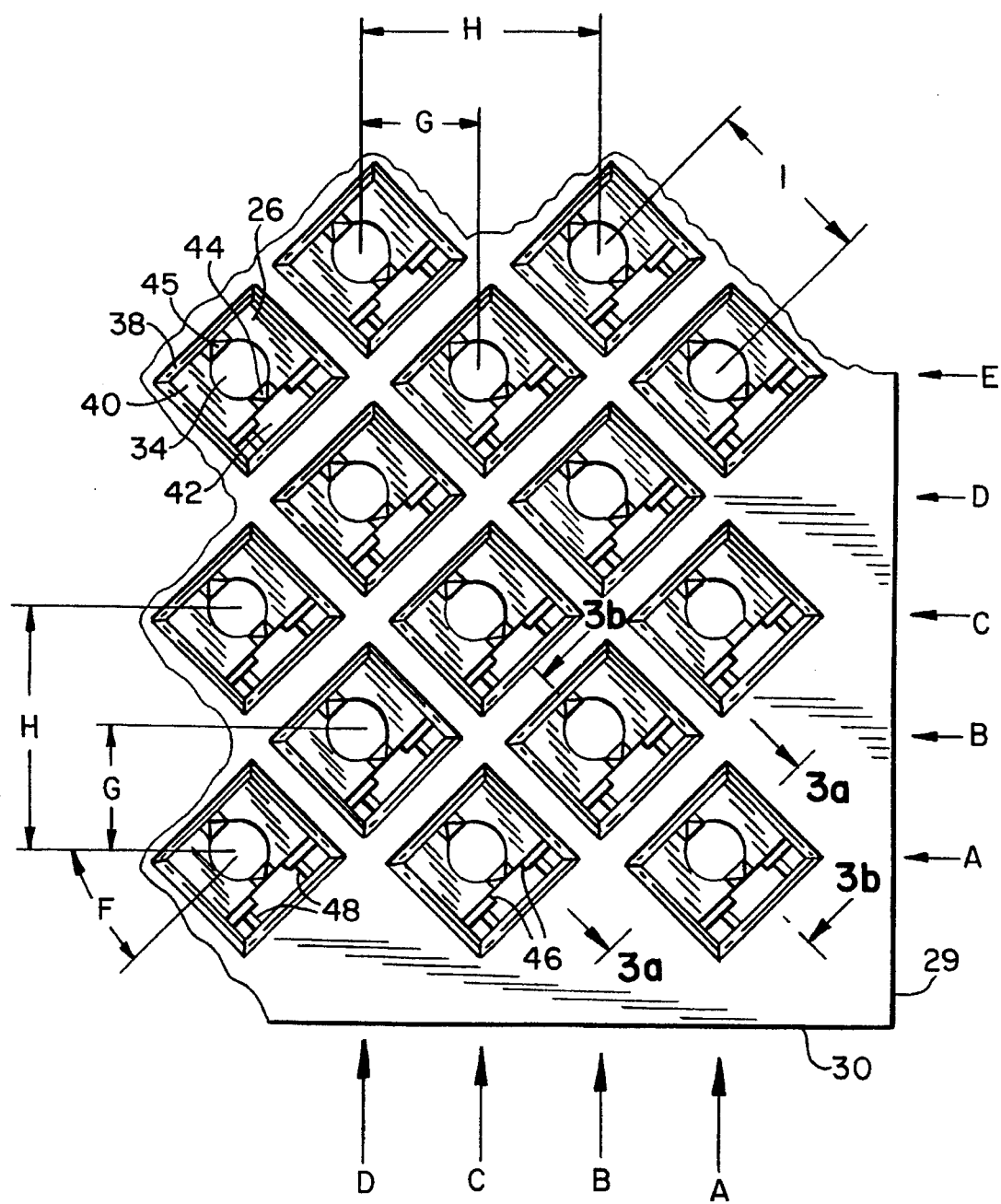
FIG. 2 is an enlarged plan bottom view of one corner of the housing of the connector shown in FIG. 1.
Figure 3A:
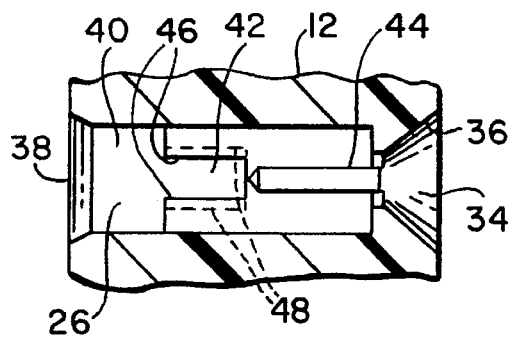
Figure 3B:
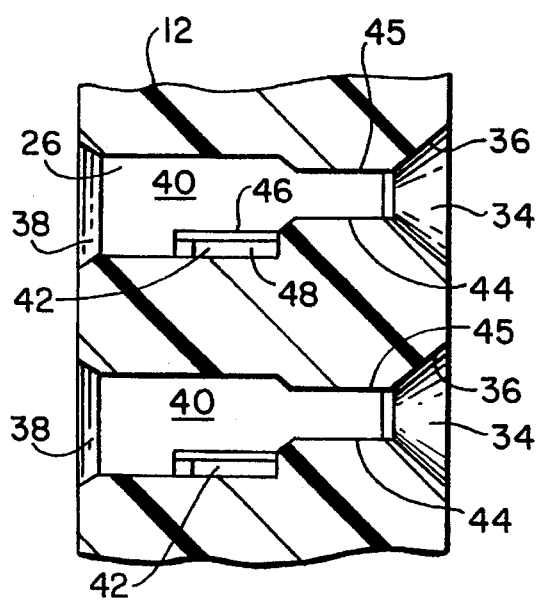
FIG. 3b is a sectional view of the housing shown in FIG. 2 taken along line 3b–3b.

Referring also to FIGS. 2, 3a and 3b the housing 12 is preferably made of a dielectric material, such as a molded plastic or polymer material. The housing 12 has a top side 16, a bottom side 18, top standoffs 20, bottom standoffs 22, and a generally square shaped center aperture 24. The housing 12 has a general square ring shape. Passing through the housing 12 between the bottom side 18 and top side 16 are a plurality of contact receiving holes 26. In the embodiment shown, all of the holes 26 are uniform and all orientated the same relative to each other. However, in alternate embodiments, variations in some of the holes and their orientation relative to each other could be provided. In the embodiment shown, two sides 28, 29 of the generally square ring shape each have four parallel rows A, B, C, D of holes 26 and two sides 30, 31 each have five parallel rows A, B, C, D, E of holes 26. Diagonal corner block section 32 can contain additional holes if required. In alternate embodiments, more or less than four and five rows of holes 26 could be provided on each side 28–31 and, the sides 28–31 could all include the same number of rows.

Each hole 26 has a top aperture 34 with a tapered lead-in 36, a bottom aperture 38, and a main middle section 40. The bottom apertures 38 are generally square shaped as seen best in FIG. 2. The main middle section 40 is generally cross-sectionally square shaped, but with a contact attachment area 42 and two prestress ribs 44, 45. The prestress ribs 44, 45 are located on opposite sides of the middle section 40 adjacent the top apertures 34. The contact attachment area 42 includes two retaining walls 46 and two contact walls 48. As seen in FIG. 2, the holes 26 are uniformly angled in each row of holes relative to the path of its row by an angle F. In the embodiment shown, the angle F is about 45°. However, in alternate embodiments, other angles could be provided, such as between 20° and 70°. This angling of the holes 26 relative to the paths of the rows of holes is clearly evident due to the general cross-sectionally square nature of the main middle section 40. This also becomes more evident from the description below of the contacts 14 and the manner in which the contacts 14 are mounted to the housing 12.

In the embodiment shown, the rows of holes A–E are spaced from adjacent rows at a centerline spacing G of about 0.05 inch. However, the holes 26 in adjacent rows A–E are interspaced, at least partially, with each other. As seen in FIG. 2, the holes 26 in adjacent rows A–E are also offset from each other by the distance G. The offset between adjacent holes is one-half the distance H between centerlines of adjacent holes in the same row. This distance H is twice the distance G. Therefore, in the embodiment shown, the distance H is about 0.10 inch. In the embodiment shown, the distance I between centerlines of adjacent holes in adjacent rows is about 0.071 inch. However, in alternate embodiments these dimensions could be changed. The features of the holes 26 being angled, the holes 26 being offset from holes in adjacent rows, and the holes 26 being interspaced with holes in adjacent rows all combine to allow a greater density of holes in the housing 12 than prior integrated circuit chip module connectors. This allows the connector 10 to have more contacts than prior known similar connectors without increasing the size or footprint of the connector on the printed circuit board. In addition, it allows conventional equipment to be used to assemble the contacts 14 with the housing 12, regardless of the potential problem that would otherwise occur from the new higher density. This is further understood from the description below.

Figure 4:
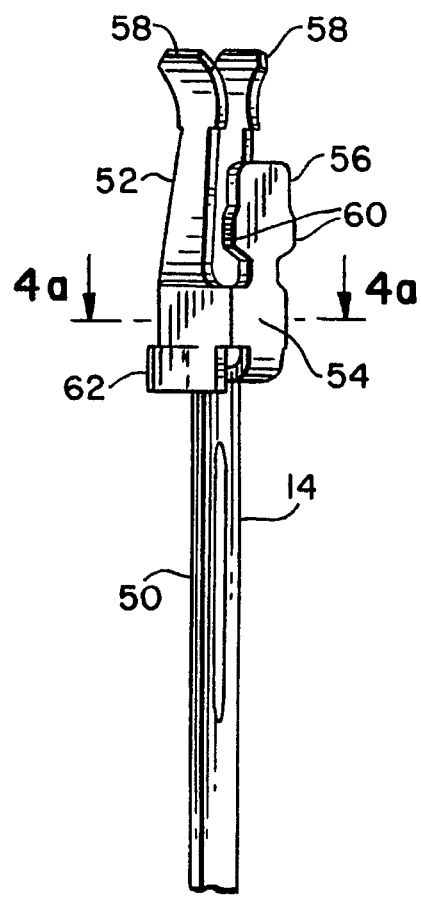
FIG. 4 is an elevational view of a contact used in the connector shown in FIG. 1.
Figure 4A:
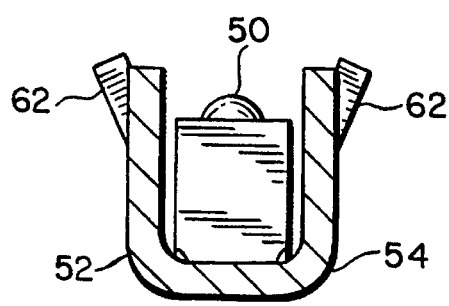

Referring to FIGS. 4 and 4a, the contacts 14 are one piece members preferably made from sheet metal. Preferably the contact areas of the contact are coated with a good conductor, such as gold. Each contact includes a tail end 50 and a contact receiving section 52. The contact receiving section 52 has a general cross-sectional U-shape with a middle section 54, a mounting section 56, and two opposing contact spring arms 58. As seen in FIG. 1, the tail ends 50 extend out of the holes 26 at the bottom side 18 of the housing 12. Referring also to FIGS. 2, 3a and 3b, the contact receiving sections 52 are fixedly mounted to the housing 12 in the contact receiving holes 26. The mounting section 56 is press-fit inserted into the contact attachment area 42. Ends 60 on the mounting section 56 are pressed into contact walls 48 and behind retaining walls 46. The middle section 54 includes side barbs 62 that also engage the housing 12 to fixedly and stably mount the contact 14 to the housing 12. The spring arms 58 extend up from the middle section 54 in general cantilever fashion from opposite sides of the general U-shape. When the contacts 14 are inserted into the contact receiving holes 26, the prestress ribs 44, 45 pass between the spring arms 58. The prestress ribs space the spring arms 58 at a predetermined spacing from each other and, prestress the spring arms 58 to allow for better contact with a male pin when the male pin is inserted between the two arms 58. In alternate embodiments, other types or shapes of contacts could be provided. In addition, other types of ways of mounting the contacts to the housing could be used.

Figure 5A:
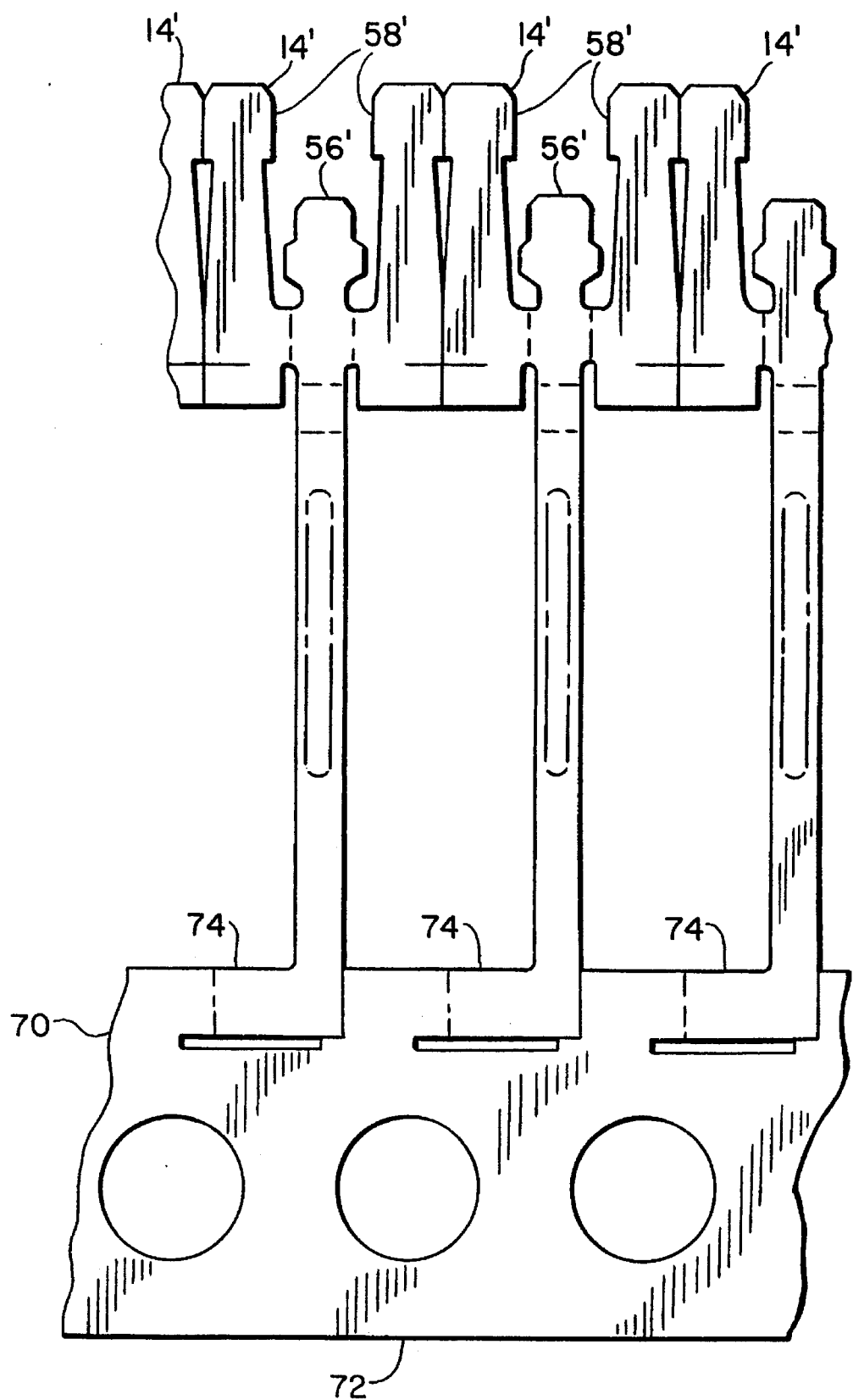
FIG. 5a shows a first step in the process of making a series of the electrical connectors shown in FIG. 4 connected by a carry strip.
Figure 5B:
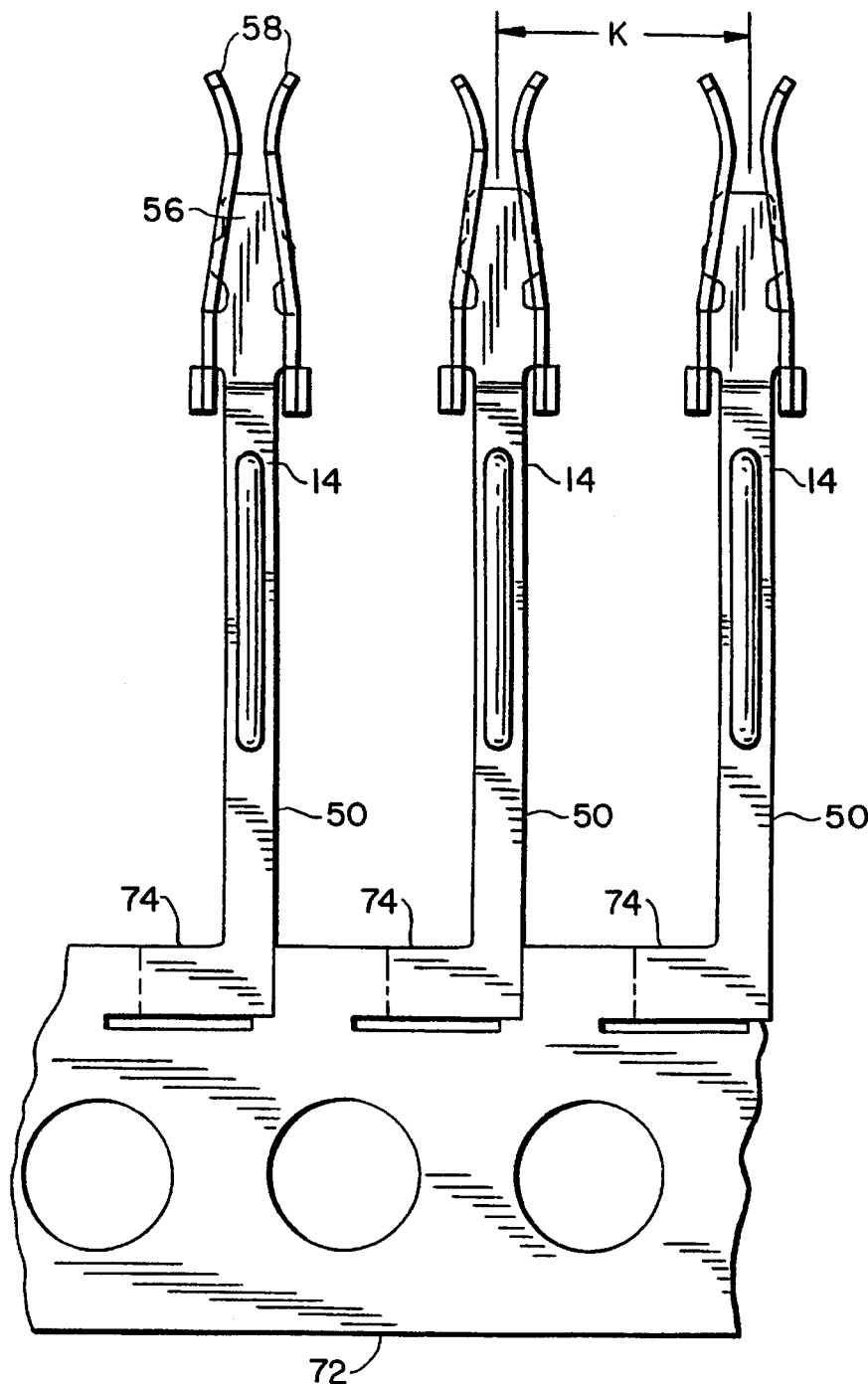
FIG. 5b shows a second step in the process of making a series of the electrical connectors shown in FIG. 4 connected by a carry strip.
Figure 5C:
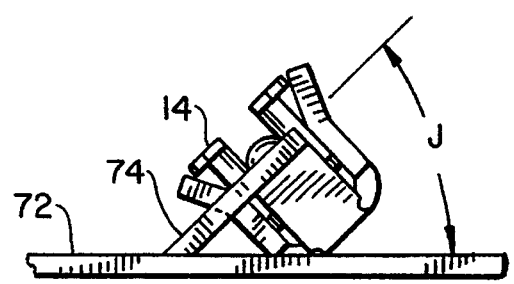
FIG. 5c shows a third step in the process of making a series of the electrical connectors shown in FIG. 4 connected by a carry strip.

Referring now to FIGS. 5a–5c, the manufacture of the contacts 14 will be described. A sheet of metal 70 is first cut, as seen in FIG. 5a, to form a plurality of contact blanks 14' connected in series to a carry strip 72 by connecting arms 74. The contact blanks 14' are then stamped or otherwise deformed into the series of contacts 14 shown in FIG. 5b. The contacts 14 are connected to the carry strip 72 by their tail ends 50. More specifically, the connecting arms 74 connect the contacts 14 to the carry strip 72. As seen in FIG. 5a, cutting of the metal forms the two contact spring arms 58' for each blank 14' on opposite sides of the center mounting section 56'. The blanks are then deformed or stamped to move the two contact spring arms into opposing relationship with each other. The spacing K between adjacent contacts 14 on the strip 72, for assembly with the housing 12 described above, is 0.1 inch; center-to-center. Finally, as seen in FIG. 5c, the connecting arms 74 are offset or bent relative to the carry strip 72 at an angle J. In the embodiment shown, the angle J is about 45°. However, in alternate embodiments other angles could be provided, such as between about 20° and about 70°. The center axes of the contacts 14 are maintained parallel to the plane of the carry strip 72 and parallel to each other. This results in the contacts 14 being turned 45°. With the contacts 14 all being turned 45° relative to their path on the carry strip 72, the contacts 14 can now be inserted as a group into the holes 26 of the housing 12. With the contacts 14 still attached to the carry strip 72, the row of contacts are aligned with a row of holes A–E at the bottom side 18 of the housing. Because the angle F of the holes 26 and angle J of the contacts 14 on the carry strip is the same, and the spacing H between holes 26 in each row and spacing K between contact 14 on the carry strip 72 is the same, the contacts 14 can be easily properly press-fit into the holes 26 of an entire row of holes 26 at the same time. The carry strip 72 is then removed from the inserted contacts.

By manufacturing the contacts 14 at a spacing K on the carry strip 72 of 0.1 inch, conventional technology can be used. This is because manufacturing contacts on carry strips at spacing of 0.1 inch has been done for any years. However, conventional electrical connectors had contacts inserted into contact holes with a minimum pitch that matched the contact pitch; 0.1 inch. The present invention, on the other hand, turns the contacts 14 an angle J to match the angle F of the angled holes 26. Because of the interspacing of the holes 26, the contacts 14 are interspaced relative to proximal contacts in adjacent rows such that the spacing G between adjacent rows of holes 26 and contacts 14 is only about 0.05 inch. Thus, the conventional technology of manufacturing contacts on a carry strip at a pitch of 0.1 inch can be used to manufacture an electrical connector with a centerline spacing between contact rows of 0.05 inch and a contact pitch between proximal contacts of about 0.071 inch. This allows more contacts to be housed in a housing without increasing the size of the housing or its footprint on a printed circuit board. This also alleviates the problems that would otherwise be encountered in trying to redesign and manufacture contacts at a smaller pitch on the carry strip.

It should be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. An electrical connector comprising:
   a housing having parallel rows of contact receiving holes, each hole having a generally cross-sectionally square shaped female contact mounting area, the holes in each row being offset from the holes in adjacent rows and, each hole being located, at least partially, between adjacent holes in adjacent rows, each of the generally cross-sectionally square shaped female contact mounting areas of the contact receiving areas being angled relative to a path of its row; and
   electrical contacts mounted to the housing in the female contact mounting areas, the contacts each having a contact receiving section with a general cross-sectional "U" shape, the "U" shape of the contact receiving sections being angled relative to the paths of the rows such that the "U" shape of the contact receiving sections are matingly aligned in the angled contact receiving holes and, are interspaced with contacts in adjacent rows.

2. An electrical connector as in claim 1 wherein the housing has a general square ring shape and, the receiving holes are arranged in a general square ring shaped pattern.

3. An electrical connector as in claim 1 wherein the contacts each have two opposing contact spring arms extending from opposite legs of the "U" shaped contact receiving section.

4. An electrical connector as in claim 3 wherein the housing includes two prestress ribs located between the contact spring arms on opposite sides of the contact spring arms to space the contact spring arms from each other at a predetermined distance.

5. An electrical connector as in claim 1 wherein the contacts each have a mounting section that extends from a top of a center portion of the "U" shaped contact receiving section that is fixedly pressed into the mounting area.

6. An electrical connector as in claim 5 wherein the contacts each have a solder tail that extends from a bottom of the center portion and out of the housing.

7. An electrical connector as in claim 1 wherein the electrical contacts in each row have a center-to-center spacing of about 0.1 inch, but electrical contacts in each row have a center-to-center spacing relative to proximate contacts in adjacent rows of about 0.07 inch.

8. An electrical connector as in claim 7 wherein the rows of contact receiving holes have centerline paths spaced about 0.05 inch from centerline path of adjacent rows.

9. An electrical connector comprising:
   a housing having parallel rows of contact receiving holes, each hole having a general rectangular column shape with a contact locating area offset and interspaced with holes in adjacent rows, the general rectangular column shapes of the holes being parallel to each other and each of the contact locating areas being angled relative to a path of its row; and
   electrical contacts mounted to the housing in the holes, the electrical contacts having female receiving sections.

10. An electrical connector as in claim 9 wherein the housing includes two prestress ribs located in each hole between contact spring arms on opposite sides of contact spring arms of the electrical contacts to space the contact spring arms from each other at a predetermined distance.

11. An electrical connector as in claim 9 wherein the electrical contacts in each row have a center-to-center spacing of about 0.1 inch, but electrical contacts in each row have a center-to-center spacing relative to proximate contacts in adjacent rows of about 0.07 inch.

12. An electrical connector as in claim 11 wherein the rows of contact receiving holes have centerline paths spaced about 0.05 inch from centerline paths of adjacent rows.

13. An electrical connector as in claim 9 wherein the electrical contacts each have a center-to-center spacing with adjacent contacts in the same row that is larger than a center-to-center spacing with proximate contacts in adjacent rows.

14. An electrical connector comprising:
   a housing having parallel rows of contact receiving holes, each hole having a generally cross-sectionally square shaped female contact mounting area, the holes in each row being offset from the holes in adjacent rows and, each hole being located, at least partially, between adjacent holes in adjacent rows; and
   electrical contacts mounted to the housing in the female contact mounting areas, the contacts each having a contact receiving section with a general cross-sectional "U" shape, the "U" shape of the contact receiving sections being angled relative to paths of the rows such that the "U" shape of the contact receiving sections are matingly aligned in the contact receiving holes and, are interspaced with contacts in adjacent rows wherein the electrical contacts each have a center-to-center spacing with adjacent contacts in the same row that is larger than a center-to-center spacing with proximate contacts in adjacent rows.

15. An electrical connector as in claim 14 wherein the housing includes two prestress ribs located in each hole between contact spring arms of the electrical contacts to space the contact spring arms from each other at a predetermined distance.

16. An electrical connector as in claim 14 wherein the center-to-center spacing of the electrical contacts in each row is about 0.1 inch, but the center-to-center spacing of the electrical contacts with proximate contacts in adjacent rows is about 0.07 inch.

17. An electrical connector as in claim 16 wherein the rows of contact receiving holes have centerline paths spaced about 0.05 inch from centerline path of adjacent rows.

* * * * *